United States Patent
Kim et al.

(10) Patent No.: US 12,324,326 B2
(45) Date of Patent: Jun. 3, 2025

(54) DISPLAY DEVICE WITH SCAN DRIVER CIRCUIT OVERLAPPING DISPLAY AREA

(71) Applicant: Samsung Display Co., Ltd., Yongin-Si (KR)

(72) Inventors: Cheaeun Kim, Seoul (KR); Juchan Park, Seoul (KR); Sunho Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 785 days.

(21) Appl. No.: 17/361,921

(22) Filed: Jun. 29, 2021

(65) Prior Publication Data

US 2022/0085132 A1 Mar. 17, 2022

(30) Foreign Application Priority Data

Sep. 11, 2020 (KR) ........................ 10-2020-0116613

(51) Int. Cl.
*H10K 59/131* (2023.01)
*H10K 59/124* (2023.01)

(52) U.S. Cl.
CPC ......... *H10K 59/131* (2023.02); *H10K 59/124* (2023.02)

(58) Field of Classification Search
CPC .......................... H10K 59/131; H10K 59/124
See application file for complete search history.

(56) References Cited

U.S. PATENT DOCUMENTS

| | | |
|---|---|---|
| 9,595,546 B2 | 3/2017 | Kim et al. |
| 10,140,909 B2 | 11/2018 | Wang |
| 10,446,081 B2 | 10/2019 | Pyon |
| 10,879,319 B2 | 12/2020 | Bang et al. |
| 11,489,025 B2 | 11/2022 | Kim et al. |
| 2015/0116295 A1* | 4/2015 | Pyon ............... H10K 50/8426 345/80 |
| 2018/0138256 A1 | 5/2018 | Han et al. |

FOREIGN PATENT DOCUMENTS

| | | |
|---|---|---|
| JP | 4630535 B2 | 2/2011 |
| JP | 2017-058671 A | 3/2017 |
| KR | 10-2015-0049640 A | 5/2015 |
| KR | 10-2017-0101203 A | 9/2017 |
| KR | 10-20180014398 A | 2/2018 |
| KR | 10-1878189 B1 | 7/2018 |
| KR | 10-20200032291 A | 3/2020 |

* cited by examiner

*Primary Examiner* — Lex H Malsawma
(74) *Attorney, Agent, or Firm* — Innovation Counsel LLP

(57) ABSTRACT

A display panel includes pixels overlapping a scan driving circuit and pixels spaced apart from the scan driving circuit. The display panel further includes a conductive pattern including a plurality of through holes, and the through holes are spaced apart in a plan view from a first electrodes of the pixels overlapping the scan driving circuit.

20 Claims, 11 Drawing Sheets

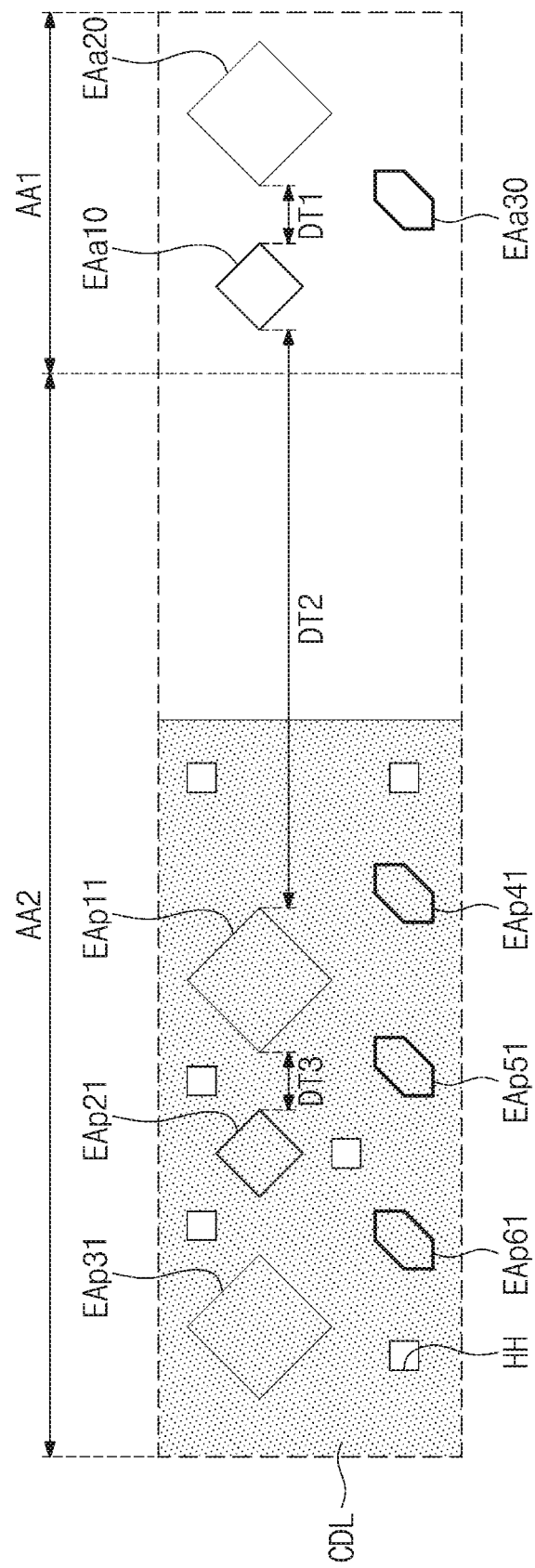

DISPLAY DEVICE WITH SCAN DRIVER CIRCUIT OVERLAPPING DISPLAY AREA

CROSS-REFERENCE TO RELATED APPLICATIONS

This U.S. non-provisional patent application claims priority under 35 U.S.C. § 119 of Korean Patent Application No. 10-2020-0116613, filed on Sep. 11, 2020, the entire contents of which are hereby incorporated by reference.

BACKGROUND

The present disclosure herein relates to a display panel, and more particularly, to a display panel with a reduced bezel.

Multimedia electronic devices such as televisions, mobile phones, tablets, computers, navigation systems, game machines, and the like have display devices for displaying images.

Recently, according to market demands, research is being conducted to reduce the area in which an image is not displayed in a display device. At the same time, research is being conducted to enlarge a display area in which an image is displayed to a user and reduce a bezel in a display device.

SUMMARY

The present disclosure provides a display panel with a reduced bezel.

An embodiment provides a display panel including a plurality of pixel circuit parts each including a pixel transistor, a first insulating layer covering the pixel transistor, and a second insulating layer disposed on the first insulating layer. A plurality of light emitting elements are disposed on the second insulating layer and each includes a first electrode connected to the pixel transistor, a second electrode disposed on the first electrode, and a light emitting layer disposed between the first electrode and the second electrode. A plurality of scan lines and a plurality of data lines are connected to the pixel circuit parts. A driving circuit is connected to the scan lines and is configured to provide signals to the pixel circuit parts. A conductive pattern is disposed between the first insulating layer and the second insulating layer and including a plurality of through holes. The first electrodes include first group electrodes spaced apart from the driving circuit in a plan view and second group electrodes overlapping the driving circuit in a plan view. The through holes are spaced apart in a plan view from the second group electrodes.

In an embodiment, the conductive pattern may overlap the driving circuit in a plan view.

In an embodiment, the conductive pattern may be connected to the second electrode.

In an embodiment, the conductive pattern may overlap the data lines in a plan view.

In an embodiment, the conductive pattern may be configured to receive a voltage different from that of the second electrode.

In an embodiment, the conductive pattern may be connected to the pixel circuit parts and may be connected to signal lines insulated from the scan lines and the data lines.

In an embodiment, the through holes may have a same shape.

In an embodiment, at least two of the through holes may have different shapes.

In an embodiment, each of the second group electrodes may include: a light emitting part overlapping the light emitting layer; and a line part connected to the light emitting part and penetrating the first insulating layer to be connected to the pixel transistor, wherein the through holes may non-overlap the light emitting part and the line part in a plan view.

In an embodiment, the light emitting part may be spaced apart in a plan view from the pixel transistor and may be configured to provide an electrical signal to the light emitting part.

In an embodiment, a separation distance in one direction between the first group electrodes may be smaller than a separation distance in the one direction between the second group electrodes In an embodiment, an area of each of the first group electrodes may be smaller than an area of each of the second group electrodes.

In an embodiment, the first insulating layer may be an organic layer.

In an embodiment, a display panel includes an organic layer, and a plurality of driving transistors disposed under the organic layer. A plurality of light emitting elements are disposed on the organic layer and each including a first electrode, a second electrode, and a light emitting layer disposed between the first electrode and the second electrode. A conductive pattern is disposed between the light emitting elements and the organic layer and overlaps some of the light emitting elements. A plurality of pixel transistors are spaced apart from the driving transistors and the light emitting layers in a plan view, and are respectively connected to the first electrodes. A plurality of through holes are defined in the conductive pattern, wherein the through holes non-overlap first electrodes of light emitting elements overlapping the conductive pattern.

In an embodiment, the conductive pattern may overlap the driving transistors, and may be configured to receive a same voltage as the second electrodes.

In an embodiment, the conductive pattern may be spaced apart from the driving transistors in a plan view and overlap a plurality of circuit wires connected to the pixel transistors in a plan view.

In an embodiment, each of the first electrodes of the light emitting elements overlapping the conductive pattern may include a light emitting part overlapping the light emitting layer and a line part connecting the light emitting part to the pixel transistor. The through holes may non-overlap each of the light emitting part and the line part.

In an embodiment, among the through holes, a through hole closer to the light emitting part may have a different shape than a through hole closer to the line part.

In an embodiment, at least two adjacent through-holes among the through-holes may have different shapes.

In an embodiment, the first electrodes of the light emitting elements overlapping the conductive pattern may have a different shape from the second electrodes of the light emitting elements non-overlapping the conductive pattern.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept.

FIGS. 6A, 6B, and 6C are plan views according to an embodiment of the inventive concept.

DETAILED DESCRIPTION

Figure 1:
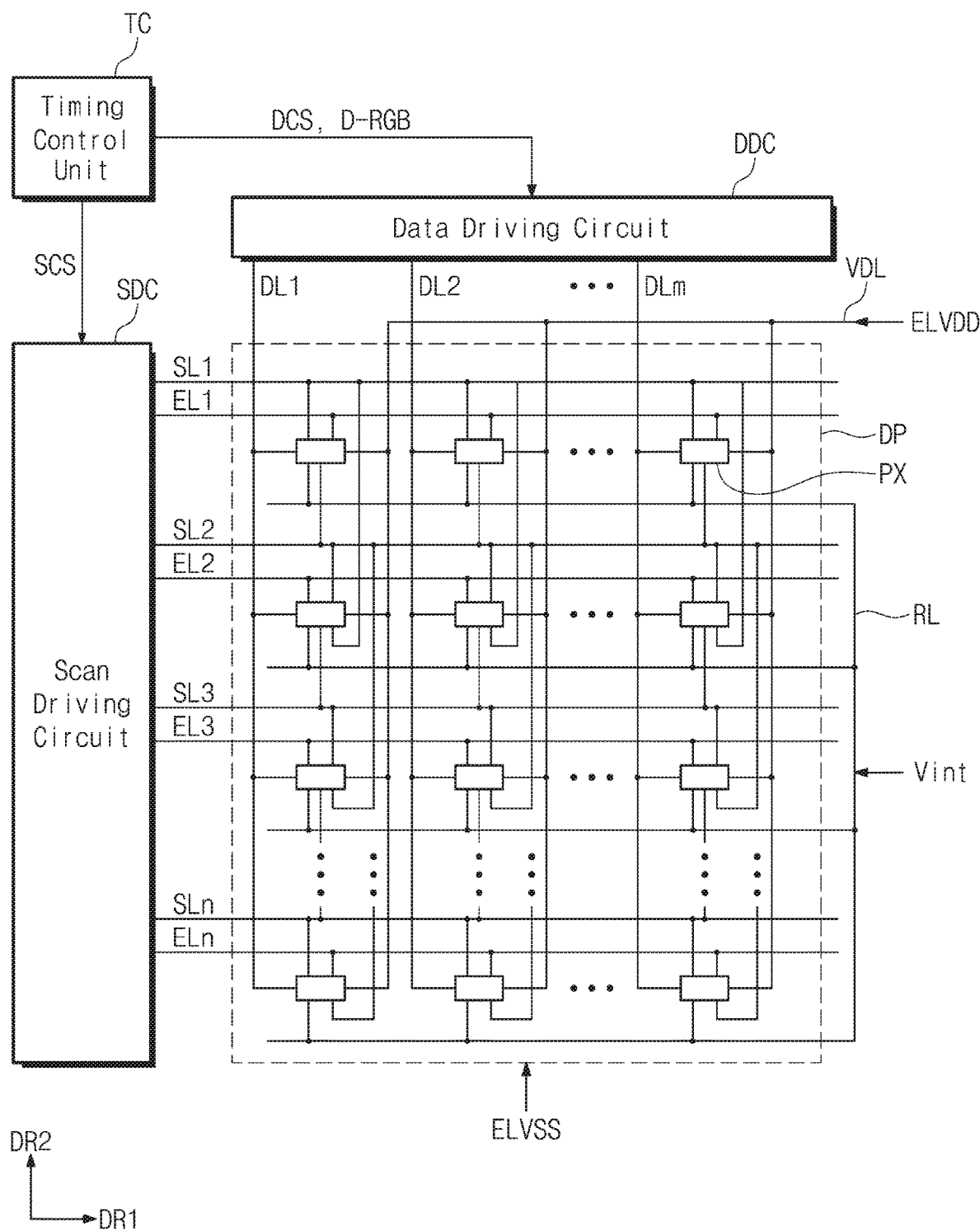
FIG. 1 is a block diagram of an electronic device according to an embodiment of the inventive concept.

In this specification, when an element or region, layer, part, etc. is referred to as being "on", "connected to", or "coupled to" another element, it means that it may be directly placed on/connected to/coupled to other components, or a third component may be arranged between them.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the inventive concept. The terms of a singular form may include plural forms unless otherwise specified.

In addition, terms such as "below", "the lower side", "on", and "the upper side" are used to describe a relationship of configurations shown in the drawing. The terms are described as a relative concept based on a direction shown in the drawing and not necessarily based on a gravitational reference.

Unless otherwise defined, all terms, including technical and scientific terms, used herein have the same meaning as commonly understood by one of ordinary skill in the art to which this inventive concept belongs. In addition, terms defined in a commonly used dictionary should be interpreted as having a meaning consistent with the meaning in the context of the related technology, and unless interpreted in an ideal or overly formal sense, the terms are explicitly defined herein.

In various embodiments of the inventive concept, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the inventive concept will be described with reference to the drawings.

FIG. 1 is a block diagram of an electronic device, e.g., a display device, according to an embodiment of the inventive concept. The electronic device according to the inventive concept may be a semiconductor device including at least one semiconductor. The electronic device includes a timing control unit TC, a scan driving circuit SDC, a data driving circuit DDC, and a display panel DP. The display panel DP displays an image according to an electrical signal.

In the present embodiment, the display panel DP is described as being an organic light emitting display panel. Meanwhile, this is described as an example, and the display panel DP according to the inventive concept may include various embodiments.

The timing control unit TC receives input image signals (not shown) and converts the data format of the input image signals to meet the specifications of the interface with the scan driving circuit SDC to generate image data D-RGB. The timing control unit TC outputs image data D-RGB and various control signals DCS and SCS.

The scan driving circuit SDC receives the scan control signal SCS from the timing control unit TC. The scan control signal SCS may include a vertical start signal for starting an operation of the scan driving circuit SDC, a clock signal for determining an output timing of the signals, and other similar signals.

The scan driving circuit SDC generates a plurality of scan signals, and sequentially outputs the scan signals to a plurality of scan lines SL1 to SLn. In addition, the scan driving circuit SDC generates a plurality of emission control signals in response to the scan control signal SCS, and outputs emission control signals to a plurality of emission lines EL1 to ELn.

FIG. 1 illustrates that scan signals and emission control signals are outputted from a single scan driving circuit SDC. However, in an embodiment of the inventive concept, a plurality of scan driving circuits may divide and output a plurality of scan signals, and may divide and output a plurality of emission control signals. In addition, in an embodiment of the inventive concept, a driving circuit for generating and outputting scan signals and a driving circuit for generating and outputting emission control signals may be separately classified.

The data driving circuit DDC receives the data control signal DCS and image data D-RGB from the timing control unit TC. The data driving circuit DDC converts the image data D-RGB into data signals and outputs the data signals to data lines DL1 to DLm. The data signals are analog voltages corresponding to gradation values of the image data D-RGB.

The display panel DP includes the scan lines SL1 to SLn, the emission lines EL1 to ELn, the data lines DL1 to DLm, and pixels PX. The scan lines SL1 to SLn extend in a first direction DR1 and are arranged in a second direction DR2 crossing the first direction DR1.

Each of the plurality of emission lines EL1 to ELn may be arranged parallel to a corresponding scan line among the scan lines SL1 to SLn. The data lines DL1 to DLm cross the scan lines SL1 to SLn and are insulated from each other.

Each of the plurality of pixels PX is connected to a corresponding scan line among the scan lines SL1 to SLn, a corresponding emission line among the emission lines EL1 to ELn, and a corresponding data line among the data lines DL1 to DLm.

Each of the pixels PX receives a first power voltage ELVDD and a second power voltage ELVSS having a level lower than that of the first power voltage ELVDD. Each of the pixels PX is connected to the driving power line VDL to which the first power voltage ELVDD is applied. Each of the pixels PX is connected to an initialization voltage line RL receiving an initialization voltage Vint.

Each of the pixels PX may be electrically connected to three scan lines. As shown in FIG. 1, the pixels PX in the second pixel row may be connected to the first to third scan lines SL1 to SL3.

Meanwhile, the display panel DP may further include a plurality of dummy scan lines. The display panel DP may further include a dummy scan line connected to the pixels PX of the first pixel row and a dummy scan line connected to the pixels PX of the n-th pixel row. Also, pixels PX, hereinafter, pixels PX of a pixel column, connected to any one of the data lines DL1 to DLm may be connected to each other. Two adjacent pixels PX among the pixels PX in the pixel column may be electrically connected. However, this has been described by way of example, and the connection relationship between the pixels PX according to the embodiment of the inventive concept may be variously designed.

Each of the pixels PX includes an organic light emitting diode (not shown) and a pixel driving circuit (not shown) for controlling light emission of the organic light emitting diode. The pixel driving circuit may include a thin film transistor and a capacitor.

In this embodiment, at least one of the scan driving circuit SDC and the data driving circuit DDC may include thin film transistors formed through the same process as the pixel driving circuit. For example, both the scan driving circuit SDC and the data driving circuit DDC may be mounted on the display panel DP. Alternatively, one of the scan driving circuit SDC and the data driving circuit DDC is mounted on the display panel DP, and the other is provided as a separate circuit board independent from the display panel DP, and may be connected to the display panel DP.

Figure 2:
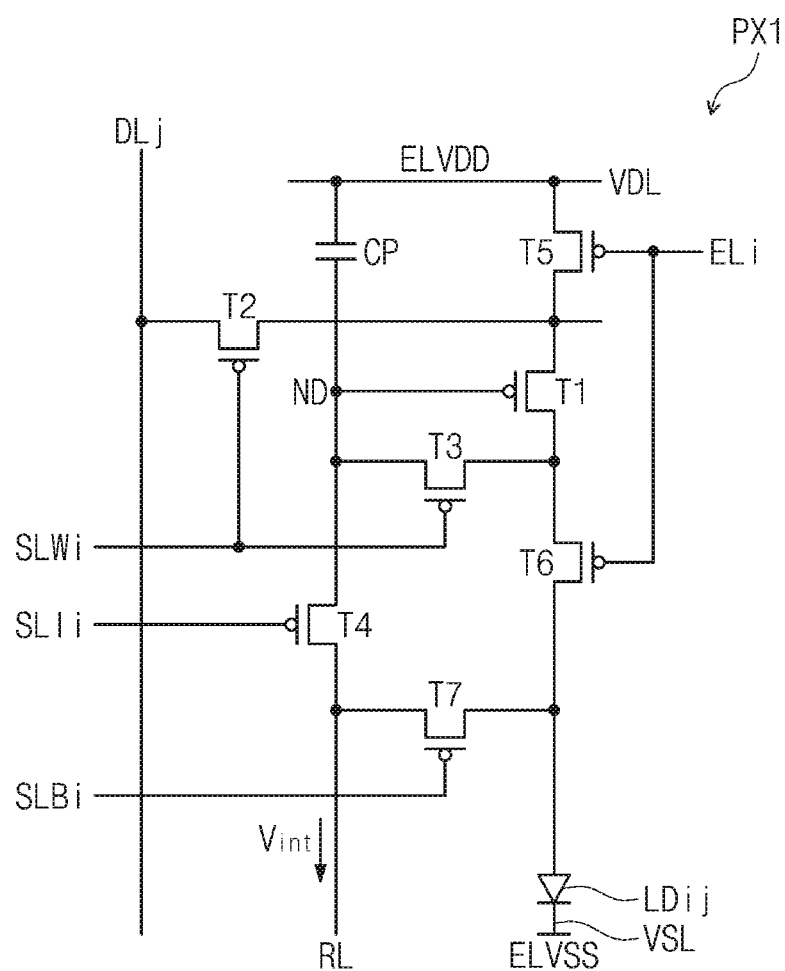
FIG. 2 is an equivalent circuit diagram of a pixel according to an embodiment of the inventive concept.

FIG. 2 is an equivalent circuit diagram of a pixel PXij according to an embodiment of the inventive concept. FIG. 2 illustrates an equivalent circuit diagram of one pixel PXij among the pixels PX illustrated in FIG. 1. Meanwhile, this is illustrated by way of example, and the equivalent circuit diagram of the pixel PXij may be variously designed.

Referring to FIG. 2, the pixel PXij may include a plurality of transistors T1-T7, a capacitor CP, and a light emitting element LDij. The first to third scan lines SLIi, SLWi, and SLBi as shown in FIG. 2 may correspond to the scan lines SLi−1, SLi, and SLi+1 shown in FIG. 1, respectively. The transistors T1-T7 and the capacitor CP may control an amount of current flowing through the light emitting element LDij in response to a data signal and a scan signal.

Each of the transistors T1-T7 may include an input electrode, e.g., a source electrode, an output electrode, e.g., a drain electrode, and a control electrode, e.g., a gate electrode. The input electrode of the first transistor T1 may be connected to the driving power line VDL through the fifth transistor T5. The driving power line VDL may be a wire to which the driving power voltage ELVDD is provided. The output electrode of the first transistor T1 is connected to the anode electrode of the light emitting element LDij through the sixth transistor T6.

The first transistor T1 may control an amount of current flowing through the light emitting element LDij in response to a voltage applied to the control electrode of the first transistor T1.

The second transistor T2 is connected between the data line DL1 and the input electrode of the first transistor T1. In addition, the control electrode of the second transistor T2 is connected to the second scan line SLWi. When a second scan signal is provided to the second scan line SLWi, the second transistor T2 is turned on to electrically connect the data line DL1 and the input electrode of the first transistor T1.

The third transistor T3 is connected between the output electrode of the first transistor T1 and the control electrode of the first transistor T1. The control electrode of the third transistor T3 is connected to the second scan line SLWi. When a second scan signal is provided to the second scan line SLWi, the third transistor T3 is turned on to electrically connect the output electrode of the first transistor T1 and the control electrode of the first transistor T1. Accordingly, when the third transistor T3 is turned on, the first transistor T1 is connected in the form of a diode.

The fourth transistor T4 is connected between a node ND and the initialization voltage line RL. In addition, the control electrode of the fourth transistor T4 is connected to the first scan line SLI1. The node ND may be a node to which the fourth transistor T4 and the control electrode of the first transistor T1 are connected. When the first scan signal is provided to the first scan line SLI1, the fourth transistor T4 is turned on to provide an initialization voltage Vint to the node ND. Here, the first scan signal may be a signal generated before the second scan signal. For example, the first scan signal may be the same signal as the signal applied to the second scan line SLWi of the previous row pixel.

The fifth transistor T5 is connected between the driving power line VDL and the input electrode of the first transistor T1. The sixth transistor T6 is connected between the output electrode of the first transistor T1 and the anode electrode of the first light emitting element LD1. The control electrode of the fifth transistor T5 and the control electrode of the sixth transistor T6 are connected to the ith emission control wire ELi.

The seventh transistor T7 is connected between the initialization voltage line RL and the anode electrode of the first light emitting element LD1. The control electrode of the seventh transistor T7 is connected to the third scan line SLBi. When the third scan signal is provided to the third scan line SLBi, the seventh transistor T7 is turned on to provide the initialization voltage Vint to the anode electrode of the first light emitting element LDij. For example, the third scan signal may be the same signal as the signal applied to the first scan line SLIi of the next row pixel.

Additionally, in FIG. 2, the control electrode of the seventh transistor T7 is shown to be connected to the third scan line SLBi. However, in an embodiment of the inventive concept, the control electrode of the seventh transistor T7 may be connected to the second scan line SLWi.

FIG. 2 illustrates a case in which the first to seventh transistors T1 to T7 are PMOS transistors. However, in an embodiment of the inventive concept, some or all of the first to seventh transistors T1 to T7 may be formed of NMOS transistors.

The capacitor CP is disposed between the driving power line VDL and the node ND. The driving power line VDL provides the above-described first power voltage ELVDD to the pixel PXij. The capacitor CP stores a voltage corresponding to the data signal. When the fifth transistor T5 and the sixth transistor T6 are turned on, the amount of current flowing through the first transistor T1 may be determined according to the voltage stored in the capacitor CP.

The light emitting element LDij may be electrically connected to the sixth transistor T6 and a driving power line VSL. The anode electrode of the light emitting element LDij is connected to the sixth transistor T6, and the cathode electrode of the light emitting element LDij is connected to the driving power line VSL. The second power voltage ELVSS may be applied to the driving power line VSL. The light emitting element LDij may emit light according to a voltage corresponding to a difference between the signal transmitted through the sixth transistor T6 and the second power voltage ELVSS.

Figure 3A:
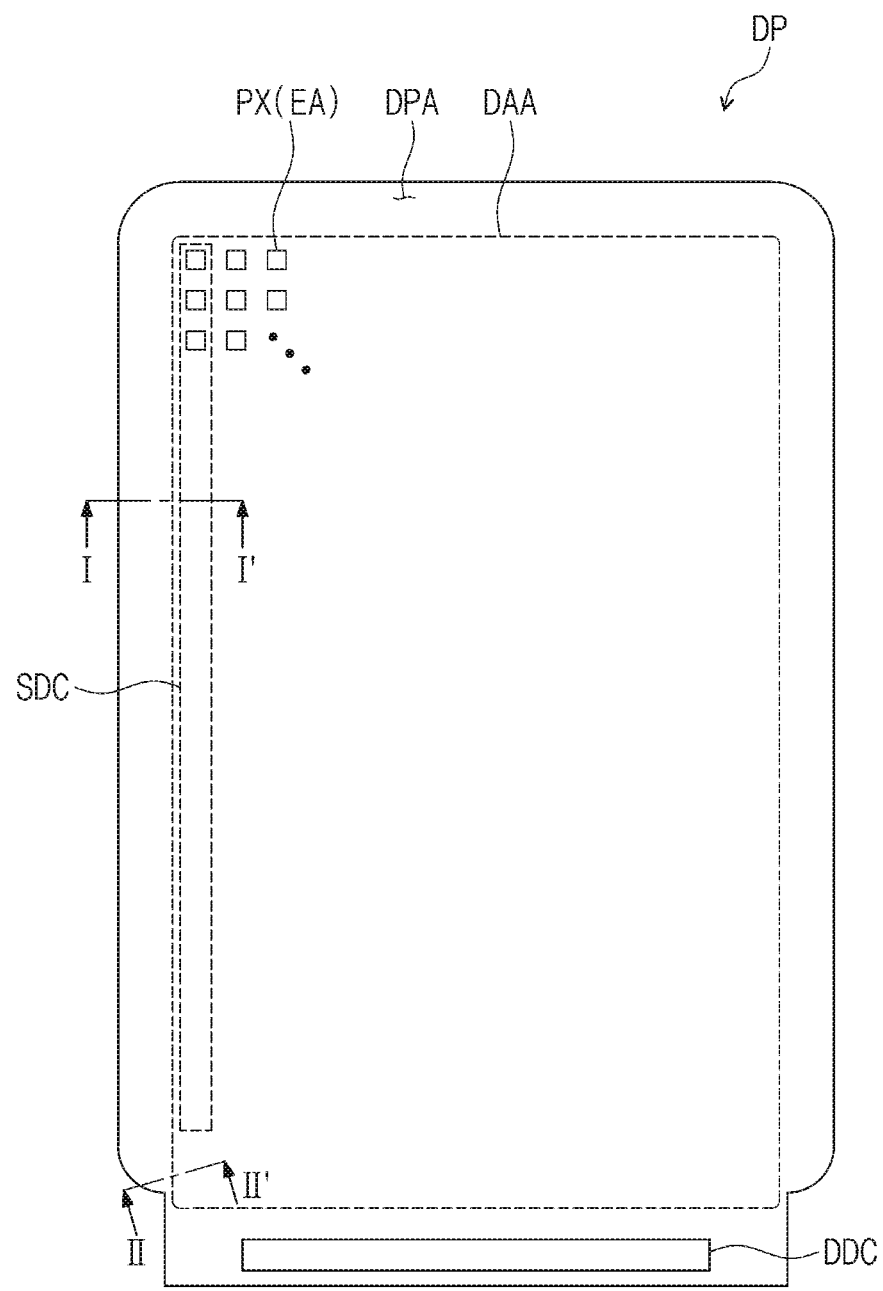
FIGS. 3A and 3B are plan views schematically illustrating a display panel according to an embodiment of the inventive concept.
Figure 3B:
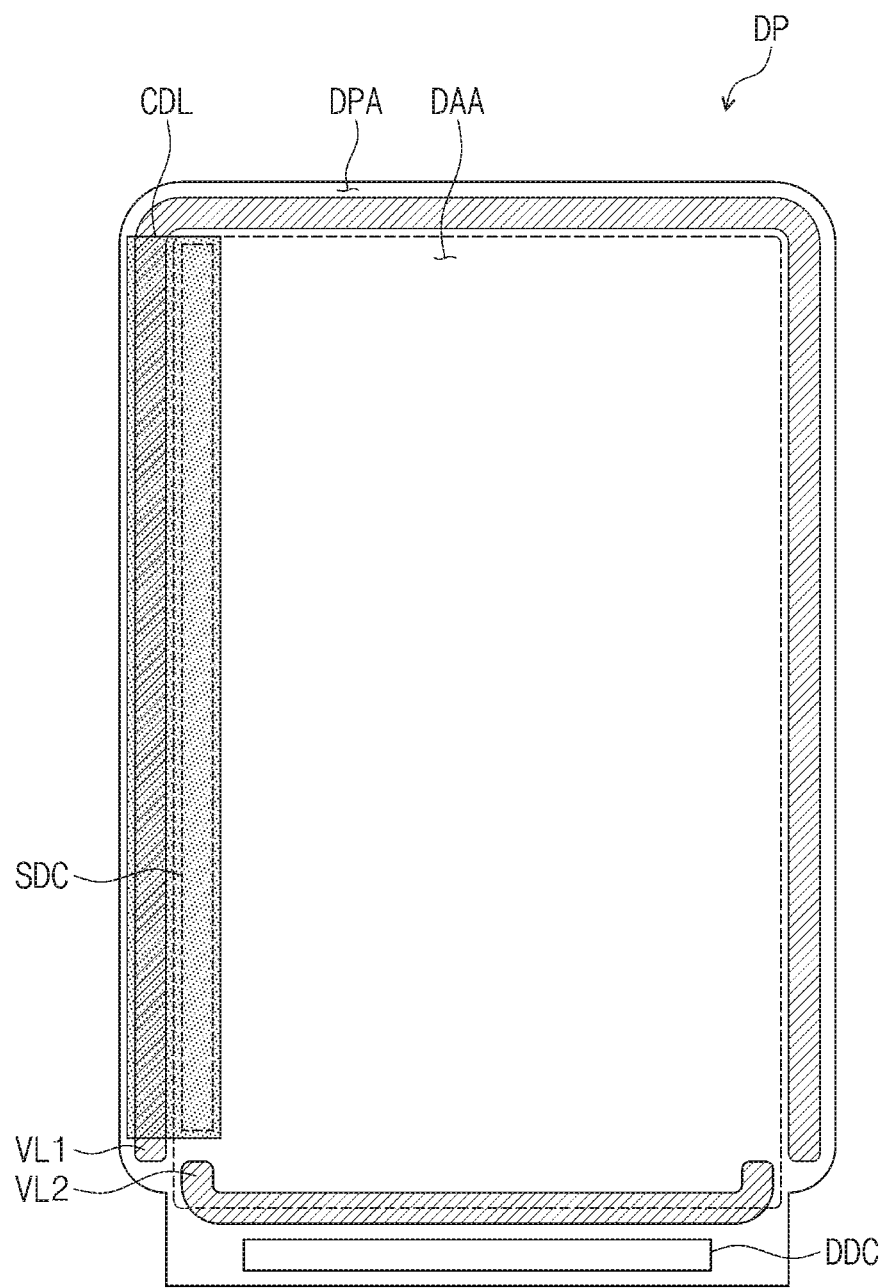

FIGS. 3A and 3B are plan views schematically illustrating a display panel DP according to an embodiment of the inventive concept. In FIGS. 3A and 3B, some components are omitted and illustrated. Hereinafter, the inventive concept will be described with reference to FIGS. 3A and 3B.

As illustrated in FIG. 3A, the display panel DP may be divided into a display area DDA and a peripheral area DPA. The display area DDA includes a plurality of light emitting areas EA. The light emitting areas EA are disposed to be spaced apart from each other.

Each of the light emitting areas EA may be an area displaying light. Each of the light emitting areas EA may correspond to an area in which an organic light emitting element to be described later is disposed, and in particular, may correspond to an area in which a light emitting layer is disposed among organic light emitting elements. A detailed description of this will be described later.

The peripheral area DPA is adjacent to the display area DDA. In this embodiment, the peripheral area DPA is shown in a shape surrounding the edge of the display area DDA. In this embodiment, the scan driving circuit SDC and the data driving circuit DDC may be mounted on the display panel DP. The scan driving circuit SDC and the data driving circuit DDC are disposed to be spaced apart from each other.

The scan driving circuit SDC is disposed in the display area DDA. The scan driving circuit SDC may overlap at least some of the light emitting areas EA in a plan view. Since the scan driving circuit SDC and the light emitting areas EA overlap, the area of the peripheral area DPA may be reduced, so that a display device having a narrow bezel may be easily implemented.

Meanwhile, the scan driving circuit SDC may be provided as two separate circuits. The two scan driving circuits SDC may be disposed to be spaced left and right with the center of the display area DPA interposed between the two scan driving circuits SDC. In an embodiment, two or more scan driving circuits SDC may be provided.

The data driving circuit DDC is disposed in the peripheral area DPA. Meanwhile, this is illustrated as an example, and the data driving circuit DDC may be disposed in the display area DPA. In this case, some of the light emitting areas EA may overlap the data driving circuit DDC in a plan view.

The data driving circuit DDC may be formed in the same process as the scan driving circuit SDC. However, this has been described by way of example, and in the electronic device according to an embodiment of the inventive concept, the data driving circuit DDC may be provided as a separate circuit board independent from the display panel DP to be connected to the display panel DP.

In FIG. 3B, some of the configurations of the display panel DP are shown for easy description. As illustrated in FIG. 3B, the display panel DP may include a power voltage line VL1, a conductive pattern CDL, and a power voltage pattern VL2.

The power voltage line VL1 receives the above-described first power voltage ELVSS and provides the received first power voltage ELVSS to the display area DDA. The power voltage line VL1 may correspond to the driving power line VSL.

The power voltage line VL1 is disposed in the peripheral area DPA. The power voltage line VL1 may extend along the edge of the display area DDA. On the other hand, this is described by way of example, and the power voltage line VL1 according to an embodiment of the inventive concept may be disposed in the display area DDA, or may be disposed across each of the display area DDA and the peripheral area DPA. That is, in the present embodiment, the power voltage line VL1 is disposed so as to be non-overlapping from the pixels PX in a plan view but the power voltage line VL1 according to an embodiment of the inventive concept may be disposed to overlap some of the pixels PX in a plan view.

The power voltage pattern VL2 is disposed in the display area DDA. Accordingly, the power voltage pattern VL2 may overlap at least some of the pixels PX in a plan view. The power voltage pattern VL2 provides a second power voltage to each of the pixels PX through power lines not shown. The power lines may correspond to the driving power line VDL shown in FIG. 2.

The conductive pattern CDL is disposed to overlap the scan driving circuit SDC. Also, the conductive pattern CDL is disposed to overlap at least some of the pixels PX. The conductive pattern CDL may be a shielding electrode. The conductive pattern CDL prevents electrical interference from the scan driving circuit SDC on the pixels PX. Accordingly, generation of noise and the like in the pixels PX disposed to overlap the scan driving circuit SCD may be reduced.

Figure 4:
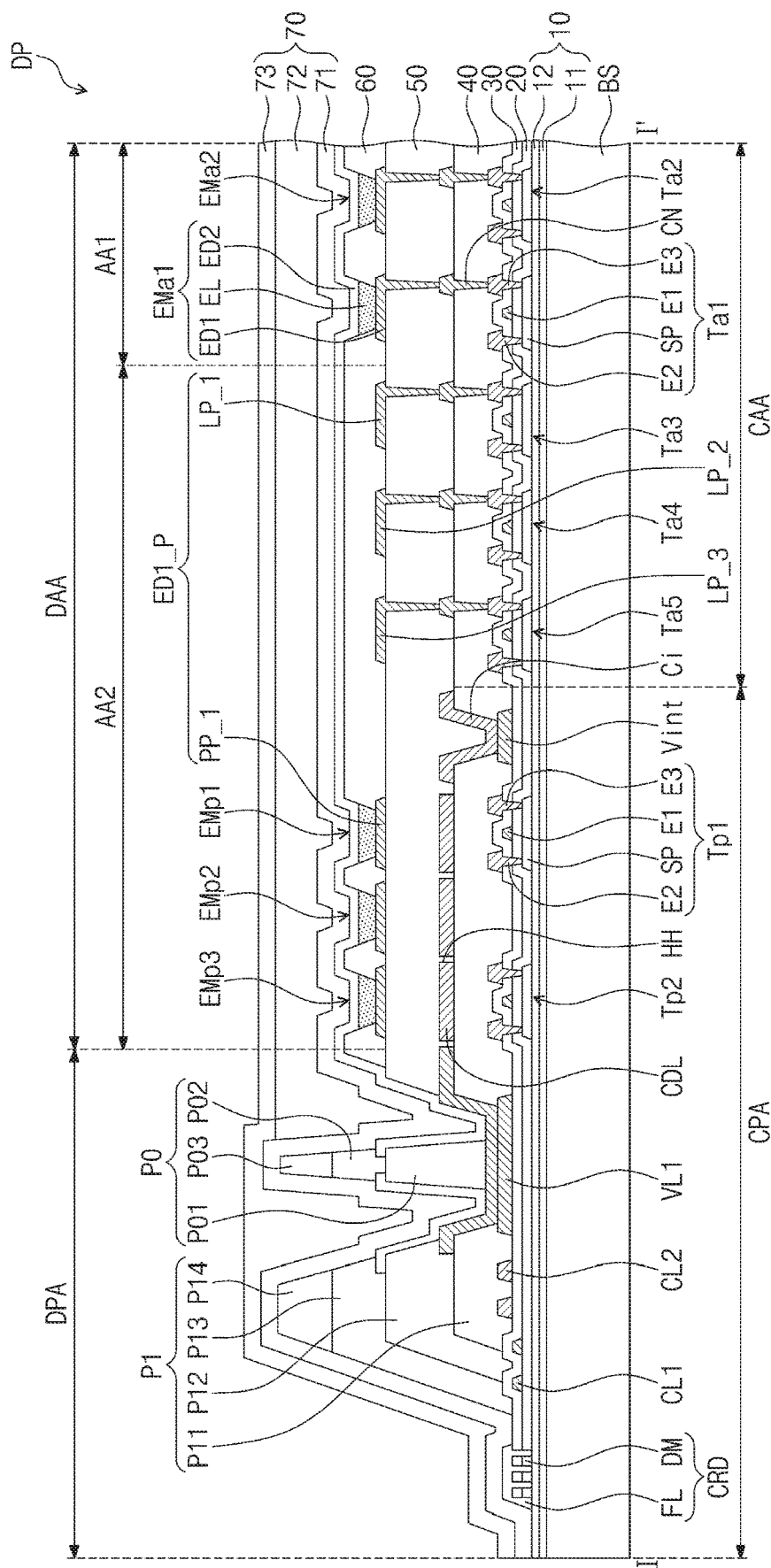
FIG. 4 is a cross-sectional view taken along line I-I' shown in FIG. 3A.
Figure 5:
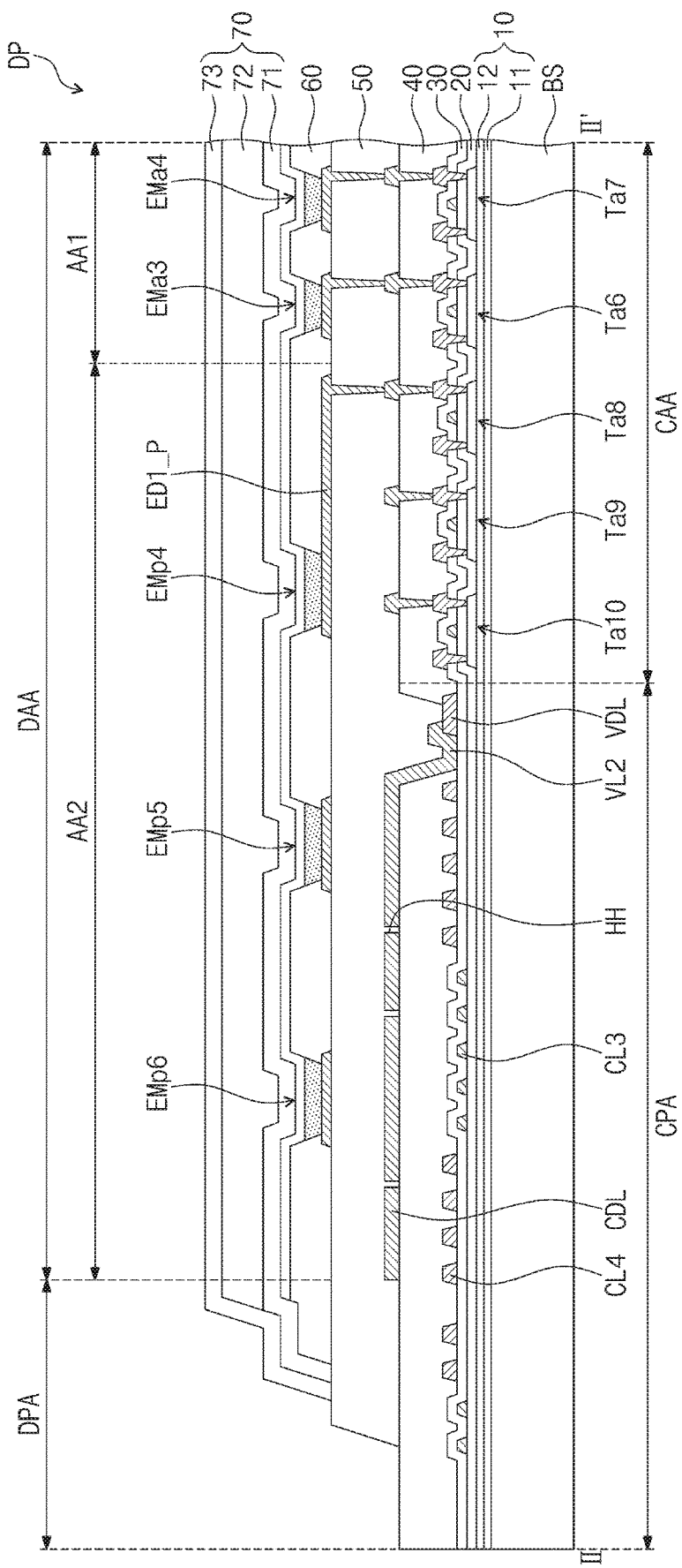
FIG. 5 is a cross-sectional view taken along line II-II' shown in FIG. 3A.

FIG. 4 is a cross-sectional view taken along line I-I' shown in FIG. 3A. FIG. 5 is a cross-sectional view taken along line II-II' shown in FIG. 3A. Hereinafter, the inventive concept will be described with reference to FIGS. 4 and 5.

As illustrated in FIG. 4, the display panel DP may be divided into a pixel circuit area CAA and a driving circuit area CPA. The pixel circuit area CAA may be defined in the display area DAA, and the driving circuit area CPA may be defined to overlap a portion of the display area DAA and the peripheral area DPA.

Pixel circuit parts constituting the pixels PX (refer to FIG. 2) may be disposed in the pixel circuit area CAA. FIG. 4 shows five pixel transistors Ta1, Ta2, Ta3, Ta4, and Ta5 among the pixel circuit parts. The five pixel transistors Ta1, Ta2, Ta3, Ta4, and Ta5 may be connected to the five light emitting elements EMa1, EMa2, EMp1, EMp2, and EMp3 that are distinguished from each other.

The pixel transistors Ta1, Ta2, Ta3, Ta4, and Ta5 are disposed on a base substrate BS. The base substrate BS may be glass, plastic, or a polymer film. In this embodiment, a first insulating layer 10 may be disposed between the base substrate BS and the pixel transistors Ta1, Ta2, Ta3, Ta4, and Ta5. The first insulating layer 10 may include a barrier layer 11 and a buffer layer 12. Each of the barrier layer 11 and the buffer layer 12 may be an inorganic layer. However, this is illustrated by way of example, and the first insulating layer 10 may be a single layer, may include a larger number of layers, or an organic layer.

Each of the pixel transistors Ta1, Ta2, Ta3, Ta4, and Ta5 includes a semiconductor pattern SP, a control electrode E1, an input electrode E2, and an output electrode E3. The semiconductor pattern SP includes a semiconductor material such as silicon and metal oxide.

The control electrode E1 is disposed to overlap the semiconductor pattern SP. An area of the semiconductor pattern SP that overlaps the control electrode E1 may be defined as a channel area. A second insulating layer 20 is disposed between the control electrode E1 and the semiconductor pattern SP. The second insulating layer 20 may be an inorganic layer, and may be a single layer or multiple layers.

The input electrode E2 and the output electrode E3 are connected to both ends of the channel area of the semiconductor pattern SP. The input electrode E2 and the output electrode E3 may be disposed on a third insulating layer 30 disposed on the second insulating layer 20. The third insulating layer 30 includes an organic material and/or an inorganic material. The input electrode E2 and the output electrode E3 pass through the second insulating layer 20 and the third insulating layer 30 and are connected to the semiconductor pattern SP.

A fourth insulating layer 40 and a fifth insulating layer 50 are sequentially stacked on the pixel transistors Ta1, Ta2, Ta3, Ta4, and Ta5. Each of the fourth insulating layer 40 and the fifth insulating layer 50 may include an organic layer or a stacked organic layer and inorganic layer. The light emitting elements EMa1, EMa2, EMp1, EMp2, and EMp3 are disposed on the fifth insulating layer 50.

The light emitting elements EMa1, EMa2, EMp1, EMp2, and EMp3 are connected to the pixel transistors Ta1, Ta2, Ta3, Ta4, and Ta5, respectively. In this embodiment, the light emitting elements EMa1, EMa2, EMp1, EMp2, and EMp3 are respectively connected to the pixel transistors Ta1, Ta2, Ta3, Ta4, and Ta5 through a connection electrode CN disposed between the fourth insulating layer 40 and the fifth insulating layer 50. On the other hand, this is illustrated by way of example, and each of the light emitting elements EMa1, EMa2, EMp1, EMp2, and EMp3 according to an embodiment of the inventive concept may penetrate the fourth insulating layer 40 and the fifth insulating layer 50 and may be directly connected to each of the pixel transistors Ta1, Ta2, Ta3, Ta4, and Ta5.

The light emitting elements EMa1, EMa2, EMp1, EMp2, and EMp3 may include first group light emitting elements EMa1 and EMa2 and second group light emitting elements EMp1, EMp2, and EMp3. The first group light emitting elements EMa1 and EMa2 are disposed in a first area AA1 of the display area DAA. The first group light emitting elements EMa1 and EMa2 are disposed to overlap the connected pixel transistors Ta1 and Ta2 in a plan view, respectively. In the present embodiment, the first area AA1 may be an area in which light emitting elements overlapping connected pixel transistors are disposed among the display area DAA. The first area AA1 may be defined in the pixel circuit area CAA.

Each of the first group light emitting elements EMa1 and EMa2 includes a first electrode ED1, a second electrode ED2, and a light emitting layer EL. The first electrode E1 is disposed on the fifth insulating layer 50 and penetrates the fifth insulating layer 50 and is connected to the connection electrode CN. A sixth insulating layer 60 includes an opening part exposing at least a portion of the first electrode E1. The sixth insulating layer 60 may include an organic material and/or an inorganic material, and may correspond to the pixel defining film.

The light emitting layer EL is disposed on and in the opening part. The light emitting layer EL includes an organic light emitting material and/or an inorganic light emitting material. Each of the first group light emitting elements EMa1 and EMa2 generates light by exciting the light emitting layer EL according to a potential difference between the first electrode ED1 and the second electrode ED2.

The second electrode ED2 is disposed on the sixth insulating layer 60. The second electrode ED2 may be provided in an integral shape covering a plurality of light emitting layers. The second electrode ED2 may be formed on the entire surface of the display area DAA.

A seventh insulating layer 70 covers the light emitting elements EMa1, EMa2, EMp1, EMp2, and EMp3. The seventh insulating layer 70 may be a thin film sealing layer.

The seventh insulating layer 70 may include a first inorganic layer 71, an organic layer 72, and a second inorganic layer 73 sequentially stacked. On the other hand, this is illustrated by way of example, and the seventh insulating layer 70 may be a single layer or may include a greater number of insulating layers, and may be a sealing substrate including glass or plastic.

The second group light emitting elements EMp1, EMp2, and EMp3 are disposed in a second area AA2 of the display area DAA. In the present embodiment, the second area AA2 may be an area in which light emitting elements not overlapping connected pixel transistors are disposed among the display area DAA. The second area AA2 may be defined to overlap a part of the pixel circuit area CAA and a part of the driving circuit area CPA.

In this embodiment, the second group light emitting elements EMp1, EMp2, and EMp3 may be disposed in the driving circuit area CPA. Circuit components other than the pixel circuit part, for example, the scan driving circuit SDC (see FIG. 1), the initialization voltage line Vint, the first power voltage line VL1, the second power voltage line VL2, the conductive pattern CDL, and a plurality of circuit wires CL1 and CL2 may be disposed in the driving circuit area CPA.

The initialization voltage line Vint may be disposed in the display area DAA and may be disposed overlapping the second area AA2. A conductive line Ci disposed on the fourth insulating layer 40 passes through the fourth insulating layer 40 and is connected to the initialization voltage line Vint, and extends toward the pixel circuit area CAA to provide an initialization voltage to the pixel circuit parts.

The scan driving circuit SDC and the initialization voltage line Vint may be disposed in an area overlapping the display area DAA in the driving circuit area CPA. In FIG. 4, some driving transistors Tp1 and Tp2 of the scan driving circuit SDC are illustrated for easy description.

The driving transistor Tp1 includes a semiconductor pattern SP, a control electrode E1, an input electrode E2, and an output electrode E3. The driving transistors Tp1 and Tp2 may be formed through the same process as the pixel transistors Ta1, Ta2, Ta3, Ta4, and Ta5. Accordingly, the driving transistor Tp1 and Tp2 may be disposed not to overlap the pixel transistors Ta1, Ta2, Ta3, Ta4, and Ta5 in a plan view.

In this embodiment, the second group of light emitting elements EMp1, EMp2, and EMp3 may be disposed on the driving transistors Tp1 and Tp2 constituting the scan driving circuit SDC. The second group light emitting elements EMp1, EMp2, and EMp3 are disposed to be spaced apart from the connected pixel transistors Ta3, Ta4, and Ta5 in a plan view. The pixel transistors Ta3, Ta4, and Ta5 connected to the second group light emitting elements EMp1, EMp2, and EMp3 are disposed in the pixel circuit area CAA. Accordingly, the first electrode ED1_P of each of the second group light emitting elements EMp1, EMp2, and EMp3 may include a light emitting part PP_1 and a line part LP_1. In FIG. 4, three line parts LP_1, LP_2, and LP_3 respectively connected to pixel transistors Ta3, Ta4, and Ta5 are illustrated.

The light emitting part PP_1 may be a part that overlaps the light emitting layer EL, and the line part LP_1 may be a part connected to the pixel transistor Ta3 through the fifth insulating layer 50 and connected to the light emitting part PP_1. In this embodiment, the light emitting part PP_1 and the line part LP_1 are illustrated in an integral shape. However, this is illustrated by way of example, and in one embodiment of the inventive concept, the light emitting part PP_1 and the line part LP_1 may be independently formed and connected.

The display panel DP according to an embodiment of the inventive concept may include a conductive pattern CDL. The conductive pattern CDL may overlap the display area DAA in a plan view. The conductive pattern CDL is disposed to overlap the second area AA and the peripheral area DPA of the display area DAA.

The conductive pattern CDL is disposed between the driving transistors Tp1 and Tp2 and the second group light emitting elements EMp1, EMp2, and EMp3. The conductive pattern CDL is connected to the first power voltage line VL1 to receive the first power voltage ELVSS (refer to FIG. 1). The conductive pattern CDL may be a shielding electrode. The conductive pattern CDL may block an effect of the current flowing through the driving transistors Tp1 and Tp2 on the second group light emitting elements EMp1, EMp2, and EMp3. Accordingly, the generation of noise in the second group light emitting elements EMp1, EMp2, and EMp3 may be prevented by the driving transistors Tp1 and Tp2.

Meanwhile, a plurality of through holes HH may be defined in the conductive pattern CDL. The through holes HH may be passages through which gas or the like that may be generated from the fourth insulating layer 40 formed under the conductive pattern CDL is discharged.

The through holes HH may be formed in an area that non-overlaps the second group light emitting elements EMp1, EMp2, and EMp3. Specifically, the through holes HH do not overlap in a plan view with the first electrodes ED1_P of the second group light emitting elements EMp1, EMp2, and EMp3. Accordingly, it is possible to prevent a decrease in the shielding effect of the first electrodes ED1_P of the conductive pattern CDL due to the through holes HH.

The first power voltage line VL1 or the circuit wires CL1 and CL2 may be disposed in the peripheral area DPA. The conductive pattern CDL extends to the peripheral area DPA, passes through the fourth insulating layer 40, and is connected to the first power voltage line VL1. In addition, the second electrode ED2 may also extend to the peripheral area DPA and may be connected to the first power voltage line VL1. Accordingly, each of the second electrode ED2 and the conductive pattern CDL may receive a first power voltage through the first power voltage line VL1. However, this is illustrated by way of example, and in the display panel DP according to an embodiment of the inventive concept, the conductive pattern CDL and the second electrode ED2 may be connected to different voltage lines.

The circuit wires CL1 and CL2 may include a plurality of first circuit wires CL1 disposed between the second insulating layer 20 and the third insulating layer 30 and a plurality of second circuit wires CL2 disposed between the third insulating layer 30 and the fourth insulating layer 40. The first circuit wires CL1 are disposed on the same layer as the control electrode E1, and the second circuit wires CL2 are disposed on the same layer as the input electrode E2 and the output electrode E3. The circuit wires CL1 and CL2 may be wires that transmit electrical signals to the driving transistors Tp1 and Tp2.

Meanwhile, the display panel DP according to the present embodiment may include a plurality of dams P0 and P1 and a crack dam CRD. The dams P0 and P1 may be disposed along the edge of the display area DDA in a plan view. The dams P0 and P1 prevent the organic layer 72 from overflowing. The dams P0 and P1 may include a first dam P0 and a second dam P1.

The first dam P0 is relatively closer to the display area DAA among the dams P0 and P1. The first dam P0 may overlap the first power voltage line VL1. The first dam P0 includes a first layer P01, a second layer P02, and a third layer P03. Each of the first layer P01, the second layer P02, and the third layer P03 is formed of an insulating material. In this embodiment, the first layer P01 may be formed of the same material as the fifth insulating layer 50, and the second layer P02 and the third layer P03 may be formed of the same material as the sixth insulating layer 60.

The second dam P1 is further spaced apart from the display area DAA among the dams P0 and P1. The second dam P1 may overlap the circuit wires CL1 and CL2. In this embodiment, the second dam P1 may include a first layer P11, a second layer P12, a third layer P13, and a fourth layer P14. For example, the first layer P11 may be formed of the same material as the fourth insulating layer 40. The second layer P12 may be formed of the same material as the fifth insulating layer 50. The third layer P13 and the fourth layer P14 may be formed of the same material as the sixth insulating layer 60. The first dam P0 and the second dam P1 may have the same layer structure, and in addition to the first dam P0 and the second dam P1, an additional dam may be further disposed in the peripheral area DPA.

The crack dam CRD may be disposed in the peripheral area DPA and may be disposed at ends of the second insulating layer 20 and the third insulating layer 30. The crack dam CRD may include a dam part DM and a filling part FL. The dam part DM includes a plurality of insulating patterns spaced apart from the display area DDA in a direction toward the edge of the display panel DP. The insulating patterns may be formed of the same material as the second insulating layer 20 and the third insulating layer 30 and may be formed at the same time.

The filling part FL may include an organic material. The filling part FL may be formed of a material having a relatively high ductility compared to the dam part DM. The filling part FL covers the dam part DM and fills the insulating patterns.

Meanwhile, as shown in FIG. 5, the display area DAA may overlap circuit wires CL3 and CL4 in a plan view. First group light emitting elements EMa3 and EMa4 are disposed in the first area AA1 of the display area DAA, and second group light emitting elements EMp4, EMp5, and EMp6 are disposed in the second area AA2. The first group of light emitting elements EMa3 and EMa4 overlap connected thin film transistors Ta6 and Ta1 in a plan view. The second group light emitting elements EMp4, EMp5, and EMp6 may be spaced apart from connected thin film transistors Ta8, Ta9, and Ta10 in a plan view.

The second group light emitting elements EMp4, EMp5, and EMp6 may overlap the circuit wires CL3 and CL4 in a plan view. In FIG. 5, among the second group light emitting elements EMp4, EMp5, and EMp6, the first light emitting element EMp4 spaced apart from the circuit wires CL3 and CL4 and the two second light emitting elements EMp5 and EMp6 overlapping the circuit wires CL3 and CL4 are illustrated by way of example.

The first light emitting element EMp4 is disposed to overlap the circuit area CAA. As described above, since the first light emitting element EMp4 is separated from the connected pixel transistor Ta8, the first electrode ED1_P having a larger area than the first group light emitting elements EMa3 and EMa4 is included in the first area AA1.

The second light emitting element Emp5 and the third light emitting element Emp6 may overlap the circuit wires CL3 and CL4 in a plan view. The circuit wires CL3 and CL4 may transmit a signal to the scan driving circuit SDC (see FIG. 1), transmit a signal to the first power voltage line VL1, or transmit a signal to the initialization voltage line Vint, and may be a part of the data lines DL1 to DLm.

A second power voltage line VL2 may be disposed between the second light emitting element Emp5 and the third light emitting element Emp6 and the circuit wires CL3 and CL4. The second power voltage line VL2 is disposed between the fourth insulating layer 40 and the fifth insulating layer 50. The second power voltage line VL2 passes through the fourth insulating layer 40 and is connected to the driving power line VDL disposed between the third insulating layer 30 and the fourth insulating layer 40. As described above, the driving power line VDL provides the second power voltage ELVDD to the pixels PX.

The second power voltage line VL2 may serve as a shielding electrode between the second light emitting element Emp5 and the third light emitting element Emp6 and the circuit wires CL3 and CL4. The second power voltage line VL2 may block an electrical influence of the current flowing through the circuit wires CL3 and CL4 on the second group light emitting elements EMp4, EMp5, and EMp6. Accordingly, the noise generation in the second group light emitting elements EMp4, EMp5 and EMp6, in particular, the second light emitting element Emp5 and the third light emitting element Emp6 overlapping the circuit wires CL3 and CL4, may be prevented by the circuit wires CL3 and CL4.

A plurality of through holes HH may be defined in the second power voltage line VL2. The through holes HH may be passages through which gas or the like that may be generated from the fourth insulating layer 40 formed under the second power voltage line VL2 is discharged. The through holes HH are formed so as to non-overlap the first electrodes ED1_P of the second group light emitting elements EMp4, EMp5, and EMp6 in a plan view. Accordingly, it is possible to prevent a decrease in the shielding effect of the first electrodes ED1_P of the second power voltage line VL2 due to the through holes HH.

According to the inventive concept, as the display area DAA is expanded to overlap with the driving circuit area CAA, some of the second group light emitting elements EMp1, EMp2, EMp3, EMp4, EMp5, and EMp6 may be disposed on the driving transistors Tp1 and Tp2 or the circuit wires CL3 and CL4. As the display panel DP further includes a conductive pattern CDL, electrical interference between the driving transistors Tp1 and Tp2 and the second group light emitting elements EMp1, EMp2, and EMp3 may be prevented. In addition, in the display panel DP, by arranging the second power voltage line VL2 between the circuit wires CL3 and CL4 and the second group light emitting elements EMp4, EMp5, and EMp6, electrical interference between circuit wires CL3 and CL4 and the light emitting elements may be prevented.

In addition, according to the inventive concept, by defining a plurality of through holes HH in the conductive patterns CDL1 and CDL2, a passage through which gas generated from the fourth insulating layer 40 may be easily discharged to the outside may be provided. As the through holes HH non-overlap the first electrodes ED1_P of the light emitting elements, it is possible to prevent a decrease in the effect of reducing noise generation in the second group light emitting elements EMp1, EMp2, EMp3, EMp4, EMp5, and EMp6 due to the through holes HH.

Figure 6B:
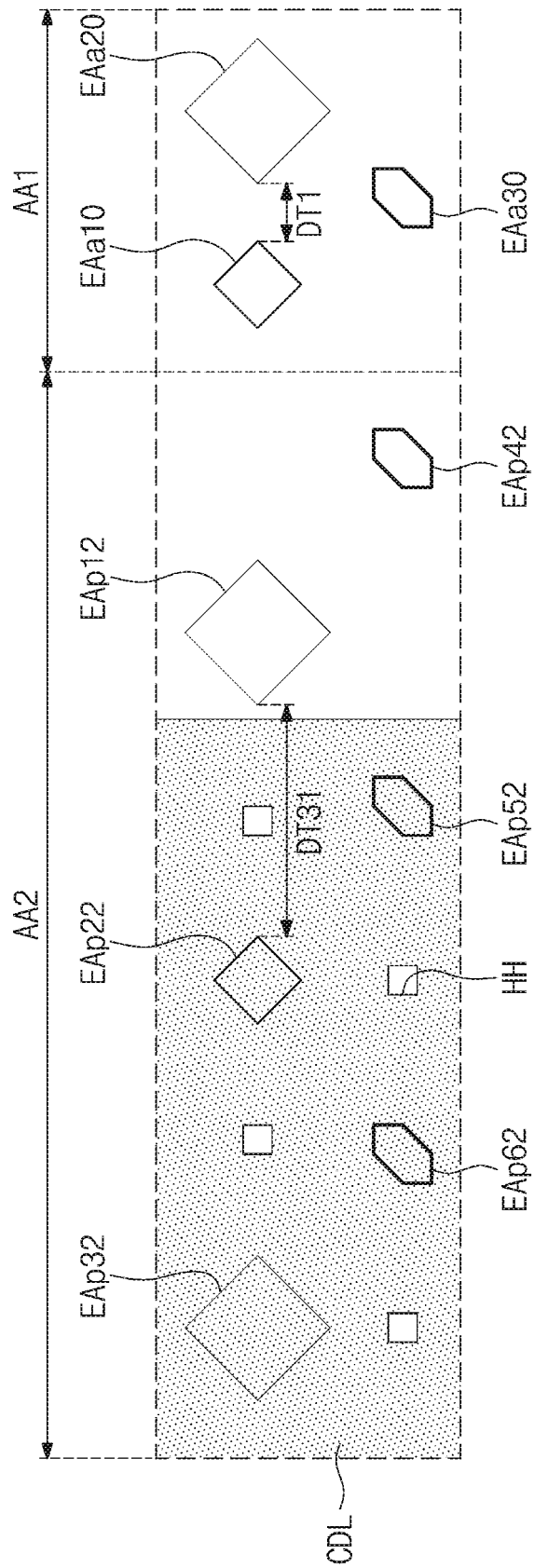
Figure 6C:
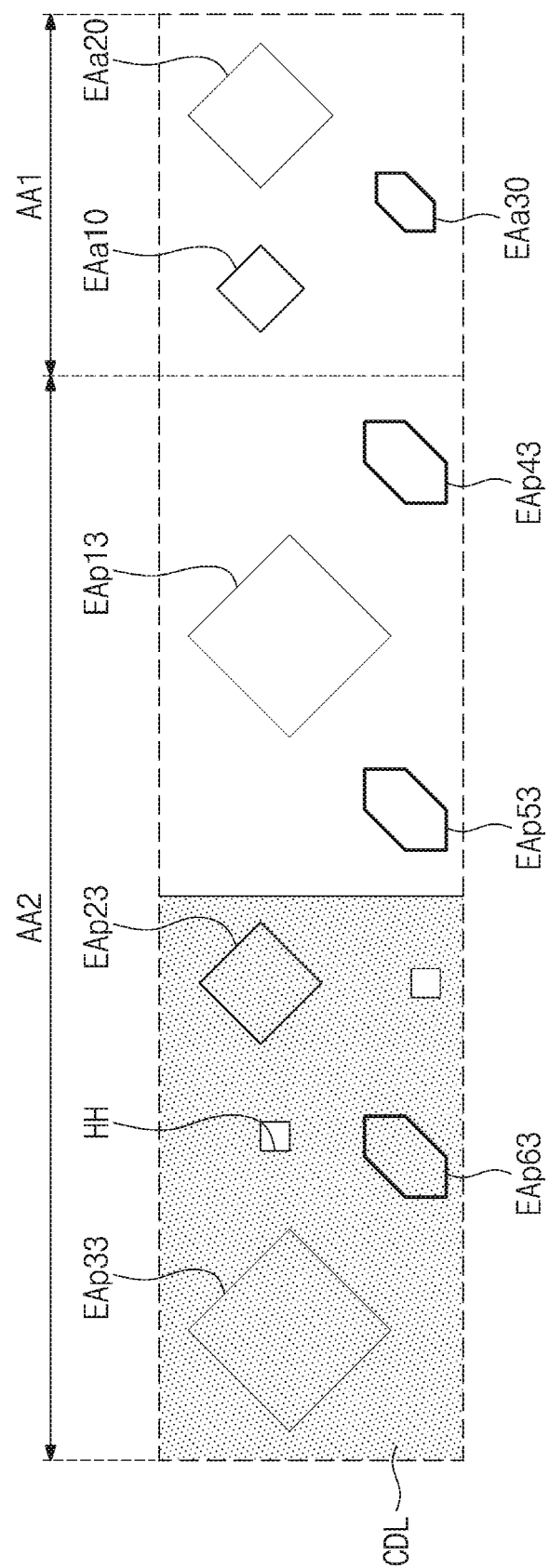

FIGS. 6A to 6C are plan views according to an embodiment of the inventive concept. FIGS. 6A to 6C illustrate partial areas where the first area AA1 and the second area AA2 contact each other. The conductive pattern CDL may be disposed in the second area AA2 and may not overlap the first area AA1. In this embodiment, the conductive pattern CDL is shown by shading. Hereinafter, the inventive concept will be described with reference to FIGS. 6A to 6C.

As shown in FIG. 6A, second group light emitting areas EAp11, EAp21, EAp31, EAp41, EAp51, and EAp61 may be disposed to overlap the conductive pattern CDL in a plan view. In this embodiment, each of the light emitting areas may substantially correspond to an opening part of the pixel defining film 60 on which the light emitting layer EL (see FIG. 4) is disposed.

A light emitting area may not be disposed between the conductive pattern CDL and the first area AA1. FIG. 6A may substantially correspond to the area illustrated in FIG. 4. Accordingly, a separation distance DT1, hereinafter, a first distance, in one direction between a first group light emitting area EAa10 adjacent to the second area AA2 and adjacent another first group light emitting area EAa20 among the first group light emitting areas EAa10, EAa20, and EAa30 may be greater than a separation distance DT2, hereinafter, a second distance, in one direction between the first group light emitting area EAa10 and adjacent another second group light emitting area EAp11. Meanwhile, a separation distance DT3, hereinafter, a third distance, in one direction between the second group light emitting areas EAp11 and EAp21 is illustrated as being equal to the first separation distance DT1 by way of example.

The conductive pattern CDL non-overlaps the first group light emitting areas EAa10, EAa20, and EAa30 in a plan view, and overlaps the second group light emitting areas EAp11, EAp21, EAp31, EAp41, EAp51, and EAp61 in a plan view. According to this embodiment, even if the second group light emitting areas EAp11, EAp21, EAp31, EAp41, EAp51, and EAp61 are arranged to overlap the driving circuit SDC, since the conductive pattern CDL serves as a shielding electrode, an electrical failure problem such as noise that may occur in the second group light emitting areas EAp11, EAp21, EAp31, EAp41, EAp51, and EAp61 may be prevented by the driving circuit SDC.

As described above, the holes HH of the conductive pattern CDL may be defined by non-overlapping the second group light emitting areas EAp11, EAp21, EAp31, EAp41, EAp51, and EAp61 in a plan view. The holes HH of the conductive pattern CDL are disposed between the second group light emitting elements EAp11, EAp21, EAp31, EAp41, EAp51, and EAp61, and are spaced apart from the first group light emitting elements EAa10, EAa20, and EAa30 in a plan view As shown in FIG. 6B, some of second group light emitting areas EAp12, EAp22, EAp32, EAp42, EAp52, and EAp62 may overlap the conductive pattern CDL and some may non-overlap the conductive pattern CDL. That is, unlike FIG. 6A, the second group light emitting areas EAp12 and EAp42 may be further disposed between the conductive pattern CDL and the first area AA1. FIG. 6B may show an area substantially corresponding to FIG. 5B.

The separation distance DT31, hereinafter referred to as the fourth distance, between the second group light emitting areas EAp12, EAp22, EAp32, EAp42, EAp52, and EAp62 may be greater than the first separation distance DT1. According to the inventive concept, by allowing the separation distance between the second group light emitting areas EAp12, EAp22, EAp32, EAp42, EAp52, and EAp62 to be greater than the separation distance between the first group light emitting areas EAa10, EAa20, and EAa30, the density of light emitting areas existing in the second area AA2 may be smaller than that of the light emitting areas existing in the first area AA1. According to the inventive concept, by reducing the density of light emitting areas disposed in the second area AA2 where the driving circuit SDC (see FIG. 1) is disposed, even with a small number of pixel driving circuits, light emitting areas disposed in the second area AA2 may be easily controlled.

Alternatively, as shown in FIG. 6C, second group light emitting areas EAp13, EAp23, EAp33, EAp43, EAp53, and EAp63 may have a larger area than the first group light emitting areas EAa10, EAa20, and EAa30. According to the inventive concept, by reducing the density and increasing the area compared to the first area AA1 with respect to the second group light emitting areas EAp13, EAp23, EAp33, EAp43, EAp53, and EAp63 disposed in the second area AA2, a resolution deviation between the first area AA1 and the second area AA2 may be reduced. Accordingly, it is not easy to distinguish between the first area AA1 and the second area AA2, thus improving visibility of the display panel.

Figure 7A:
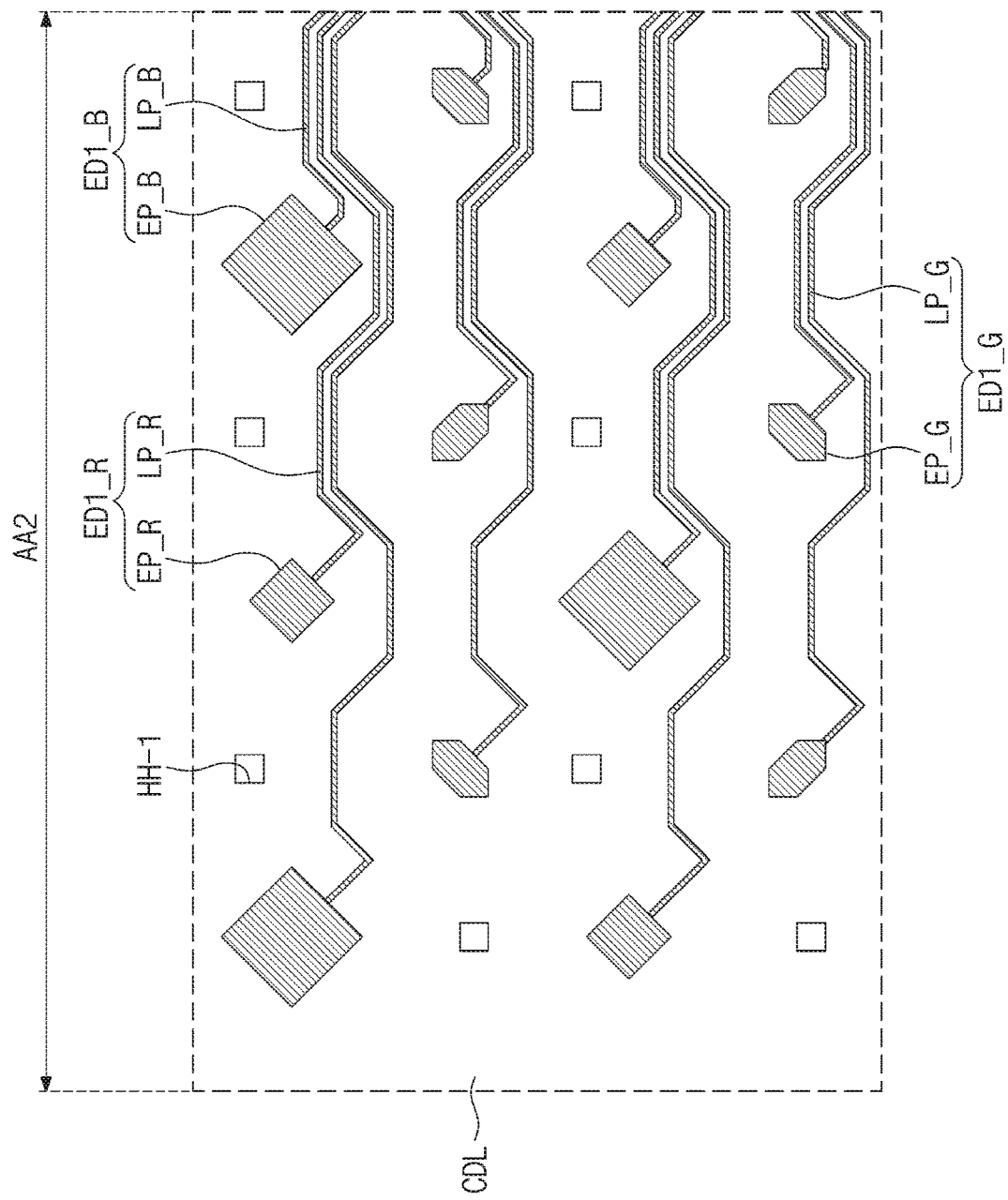
FIGS. 7A and 7B are plan views illustrating a part of a display panel according to an embodiment of the inventive concept.
Figure 7B:
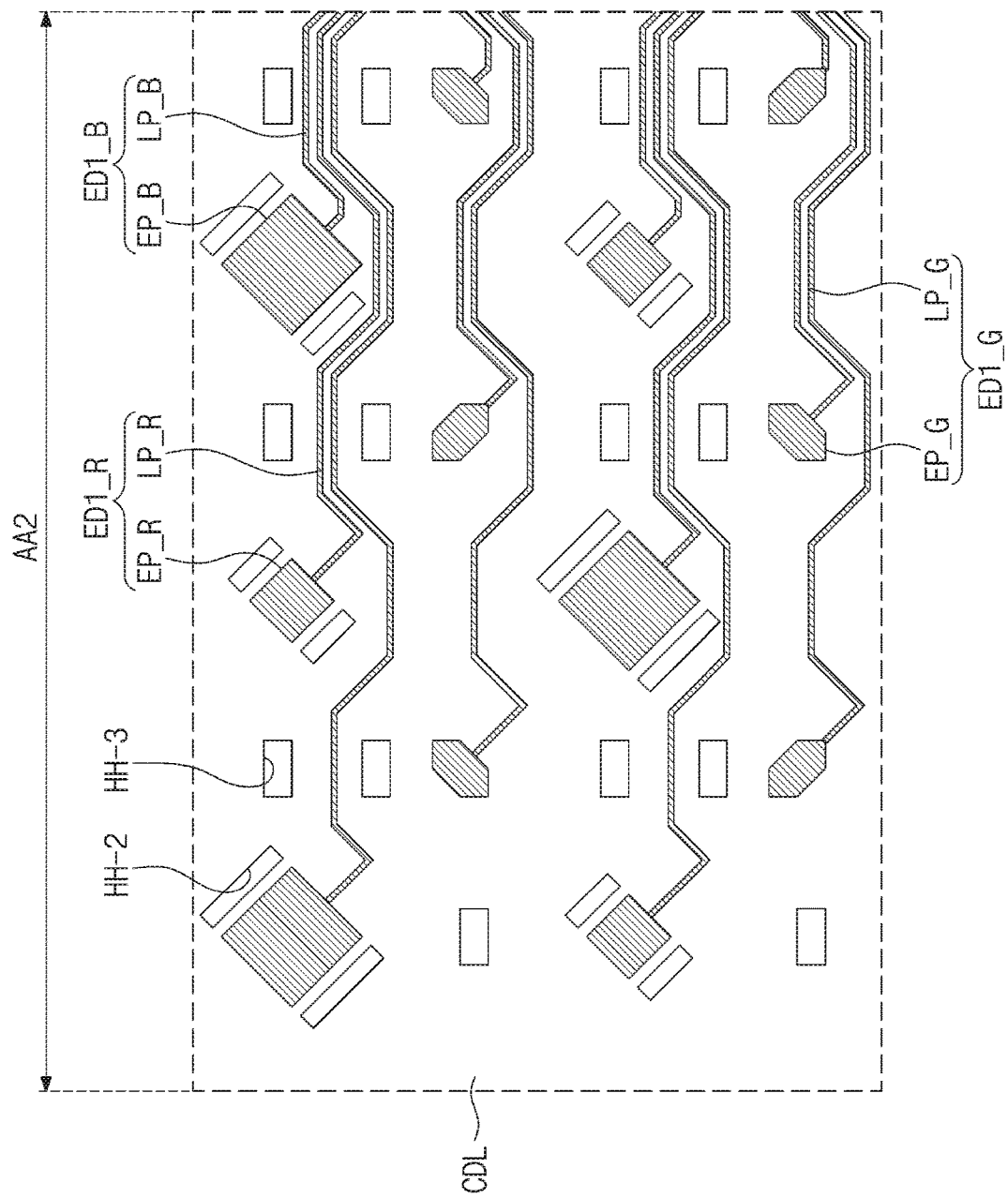

FIGS. 7A and 7B are plan views illustrating a part of a display panel according to an embodiment of the inventive concept. In FIGS. 7A and 7B, some areas of the second area AA2 are shown, and some configurations are briefly shown for easy description. Hereinafter, the inventive concept will be described with reference to FIGS. 7A and 7B.

As shown in FIG. 7A, second group first electrodes ED1_R, ED1_G, and ED1_B may include line parts LP_R, LP_G, and LP_B and light emitting part EP_R, EP_G, and EP_B, respectively. The light emitting parts EP_R, EP_G, and EP_B may correspond to the above-mentioned light emitting areas, respectively.

The line parts LP_R, LP_G, and LP_B are respectively connected to the corresponding light emitting parts EP_R, EP_G, and EP_B among the light emitting parts EP_R, EP_G, and EP_B. The line parts LP_R, LP_G, and LP_B are spaced apart from each other in a plan view to prevent an electrical short.

Each of the line parts LP_R, LP_G, and LP_B may extend to the first area AA1 and may be respectively connected to pixel transistors not shown. According to the inventive concept, the second group first electrodes ED1_R, ED1_G, and ED1_B include line parts LP_R, LP_G, and LP_B, and thus may be easily electrically connected to non-overlapping pixel transistors.

Through holes HH-1 disposed in the conductive pattern CDL non-overlap the second group first electrodes ED1_R, ED1_G, and ED1_B in a plan view. Accordingly, the through holes HH-1 may be formed to be spaced apart from the light emitting parts EP_R, EP_G, and EP_B, as well as the line parts LP_R, LP_G, and LP_B. Accordingly, a problem in that the shielding role of the conductive pattern CDL for the second group first electrodes ED1_R, ED1_G, and ED1_B is deteriorated due to the through holes HH-1 may be prevented.

Alternatively, as shown in FIG. 7B, through holes HH-2 and HH-3 may be designed to have various shapes and structuring. For example, among the through holes HH-2 and HH-3, the first through holes HH-2 may be formed at the edges of the light emitting parts EP_R, EP_G, and EP_B, and the second through holes HH-3 may be formed at the edges of the line parts LP_R, LP_G, and LP_B. In addition, the through holes HH-2 and HH-3 may be formed in different lengths or shapes according to the shape of the light emitting parts EP_R, EP_G, and EP_B or the shape of the line parts LP_R, LP_G, and LP_B.

According to the inventive concept, by forming the through holes HH-1, HH-2, and HH-3 in the conductive pattern CDL at a position that non-overlaps the second group first electrodes ED1_R, ED1_G, and ED1_B in a plan view, while maintaining the role of the shielding electrode of the conductive pattern CDL, a gas discharge path in the insulating layer under the conductive pattern CDL may be stably provided. Accordingly, a display panel having improved process reliability and electrical reliability may be provided.

According to the inventive concept, a display panel in which a display area is extended to an area where a driving circuit is disposed may be provided.

Further, according to the inventive concept, a display panel having improved process reliability and electrical reliability and improved visibility may be provided.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. A display panel comprising:
a plurality of pixel circuit parts each including a pixel transistor;
a first insulating layer covering the pixel transistor;
a second insulating layer disposed on the first insulating layer;
a plurality of light emitting elements disposed on the second insulating layer and each including a first electrode connected to the pixel transistor, a second electrode disposed on the first electrode, and a light emitting layer disposed between the first electrode and the second electrode;
a plurality of scan lines and a plurality of data lines connected to the pixel circuit parts;
a driving circuit connected to the scan lines and configured to provide signals to the pixel circuit parts; and
a conductive pattern disposed between the first insulating layer and the second insulating layer and including a plurality of through holes, the conductive pattern receiving a constant voltage,
wherein the first electrodes comprise first group electrodes spaced apart from the driving circuit in a plan view and second group electrodes overlapping the driving circuit in a plan view,
wherein each of the first group electrodes and the second group electrodes overlaps each of the light emitting layers,
wherein each of the first group electrodes and the second group electrodes are electrically insulated from the conductive pattern, and
wherein the through holes are spaced apart in a plan view from the second group electrodes.

2. The display panel of claim 1, wherein the conductive pattern overlaps the driving circuit in a plan view.

3. The display panel of claim 2, wherein the conductive pattern is connected to the second electrode.

4. The display panel of claim 1, wherein the conductive pattern overlaps the data lines in a plan view.

5. The display panel of claim 1, wherein the conductive pattern is configured to receive a voltage different from that of the second electrode.

6. The display panel of claim 1, wherein the conductive pattern is connected to the pixel circuit parts and is connected to signal lines insulated from the scan lines and the data lines.

7. The display panel of claim 1, wherein the through holes have a same shape in a plan view.

8. The display panel of claim 1, wherein at least two of the through holes have different shapes in a plan view.

9. The display panel of claim 1, wherein each of the second group electrodes comprises:
a light emitting part overlapping the light emitting layer; and
a line part connected to the light emitting part and penetrating the first insulating layer to be connected to the pixel transistor,
wherein the through holes non-overlap the light emitting part and the line part in a plan view.

10. The display panel of claim 9, wherein the light emitting part is spaced apart in a plan view from the pixel transistor configured to provide an electrical signal to the light emitting part.

11. The display panel of claim 1, wherein a separation distance in one direction between the first group electrodes is smaller than a separation distance in the one direction between the second group electrodes.

12. The display panel of claim 1, wherein an area of each of the first group electrodes is smaller than an area of each of the second group electrodes.

13. The display panel of claim 1, wherein the first insulating layer is an organic layer.

14. A display panel comprising:
an organic layer;
a plurality of driving transistors disposed under the organic layer;
a plurality of light emitting elements disposed on the organic layer and each including a first electrode, a second electrode, and a light emitting layer disposed between the first electrode and the second electrode;
a conductive pattern disposed between the light emitting elements and the organic layer and overlapping some of the light emitting elements; and
a plurality of pixel transistors spaced apart from the driving transistors and the light emitting layers in a plan view, and respectively connected to the first electrodes,
wherein a plurality of through holes are defined in the conductive pattern,
wherein the through holes non-overlap first electrodes of light emitting elements overlapping the conductive pattern.

15. The display panel of claim 14, wherein the conductive pattern overlaps the driving transistors, and is configured to receive a same voltage as the second electrodes.

16. The display panel of claim 14, wherein the conductive pattern is spaced apart from the driving transistors in a plan view and overlaps a plurality of circuit wires connected to the pixel transistors in a plan view.

17. The display panel of claim 14, wherein each of the first electrodes of the light emitting elements overlapping the conductive pattern comprises a light emitting part overlapping the light emitting layer and a line part connecting the light emitting part to the pixel transistor,
wherein the through holes non-overlap each of the light emitting part and the line part.

18. The display panel of claim 17, wherein among the through holes, a through hole closer to the light emitting part has a different shape than a through hole closer to the line part.

19. The display panel of claim 14, wherein at least two adjacent through-holes among the through-holes have different shapes in a plan view.

20. The display panel of claim 14, wherein the first electrodes of the light emitting elements overlapping the conductive pattern have a different shape from the second electrodes of the light emitting elements non-overlapping the conductive pattern in a plan view.

* * * * *